United States Patent [19]

Nelson

[11] 4,355,889
[45] Oct. 26, 1982

[54] APPARATUS AND METHOD FOR RESIZING ARTWORK

[75] Inventor: Richard H. Nelson, Des Moines, Iowa

[73] Assignee: Forward Graphics, Inc., Des Moines, Iowa

[21] Appl. No.: 276,716

[22] Filed: Jun. 23, 1981

[51] Int. Cl.³ .............................................. G03B 27/32
[52] U.S. Cl. ........................................ 355/39; 355/56; 355/63
[58] Field of Search ..................... 355/39, 63, 64, 56

[56] References Cited

U.S. PATENT DOCUMENTS

| | | | |
|---|---|---|---|
| 2,303,920 | 12/1942 | Drucker | 355/63 |
| 3,044,351 | 7/1962 | Patterson | 355/64 |
| 3,186,297 | 1/1965 | Wally | 355/64 |
| 3,253,502 | 5/1966 | Wally | 355/56 |
| 3,880,511 | 4/1975 | Astarloa | 355/63 |

Primary Examiner—Monroe H. Hayes
Attorney, Agent, or Firm—Henderson & Sturm

[57] ABSTRACT

An apparatus and method for resizing artwork by using in combination with a headline setter device, an apparatus which allows the headline setter device to be used in addition to its normal typesetting function, to resize existing artwork.

12 Claims, 15 Drawing Figures

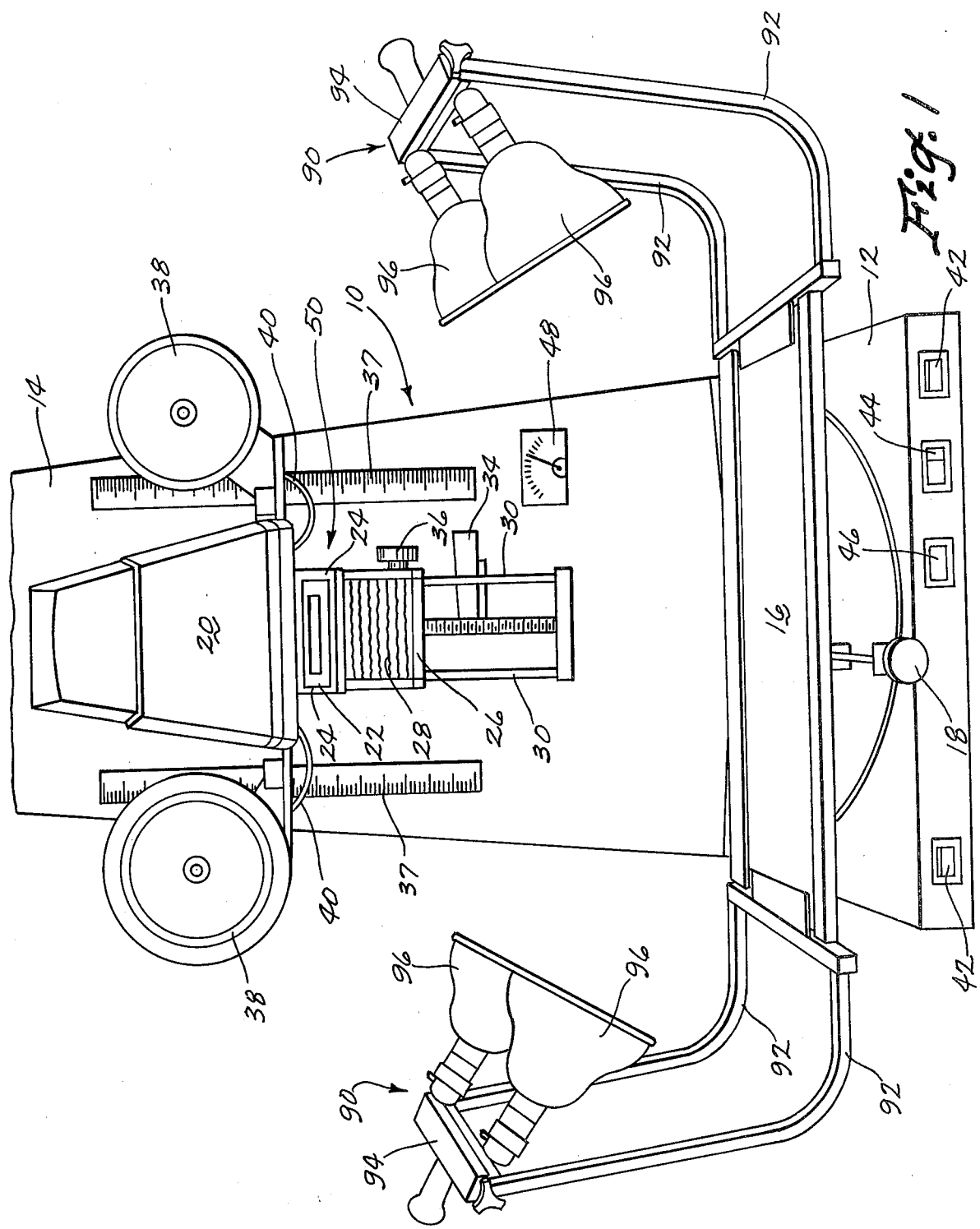

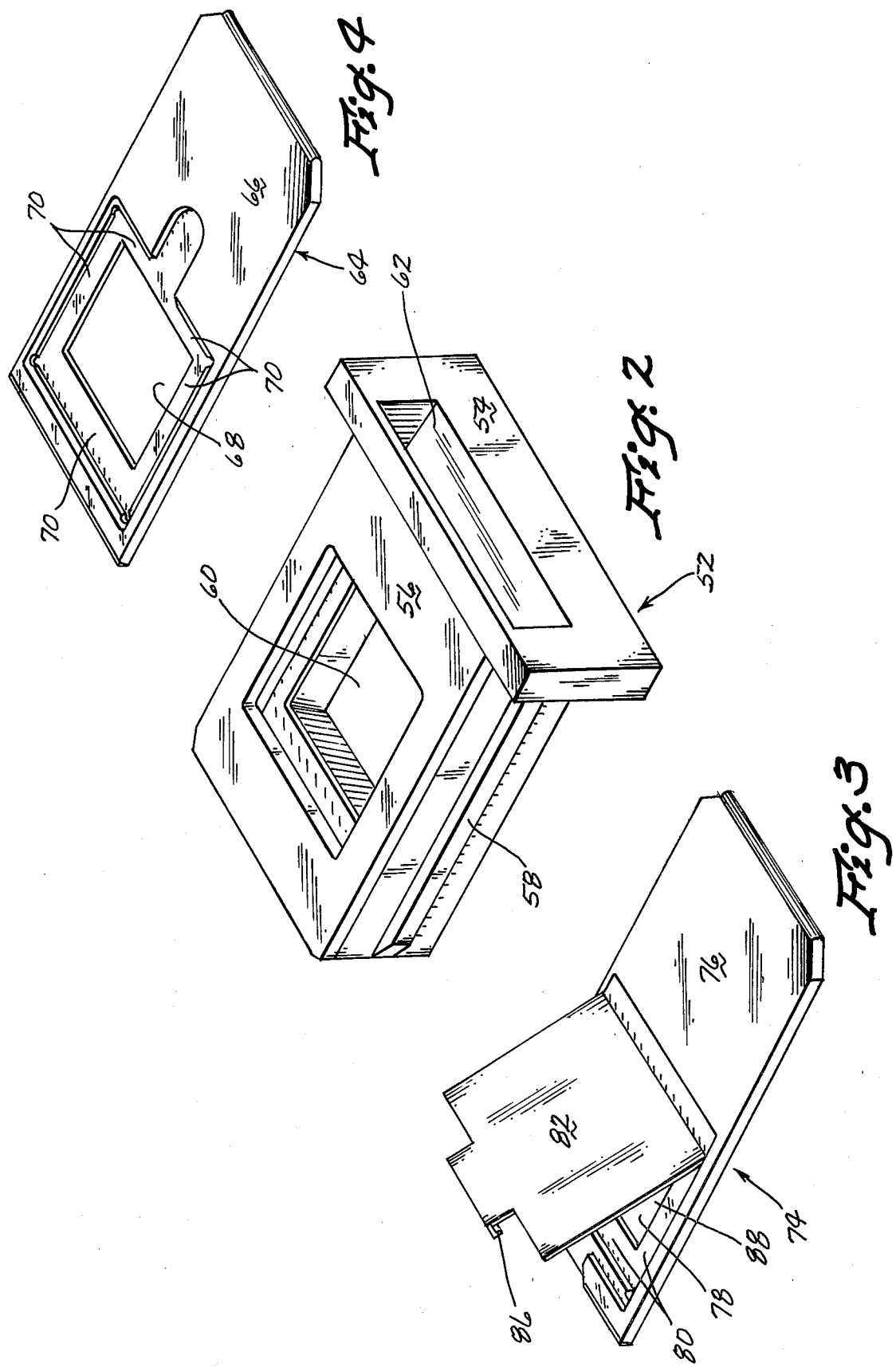

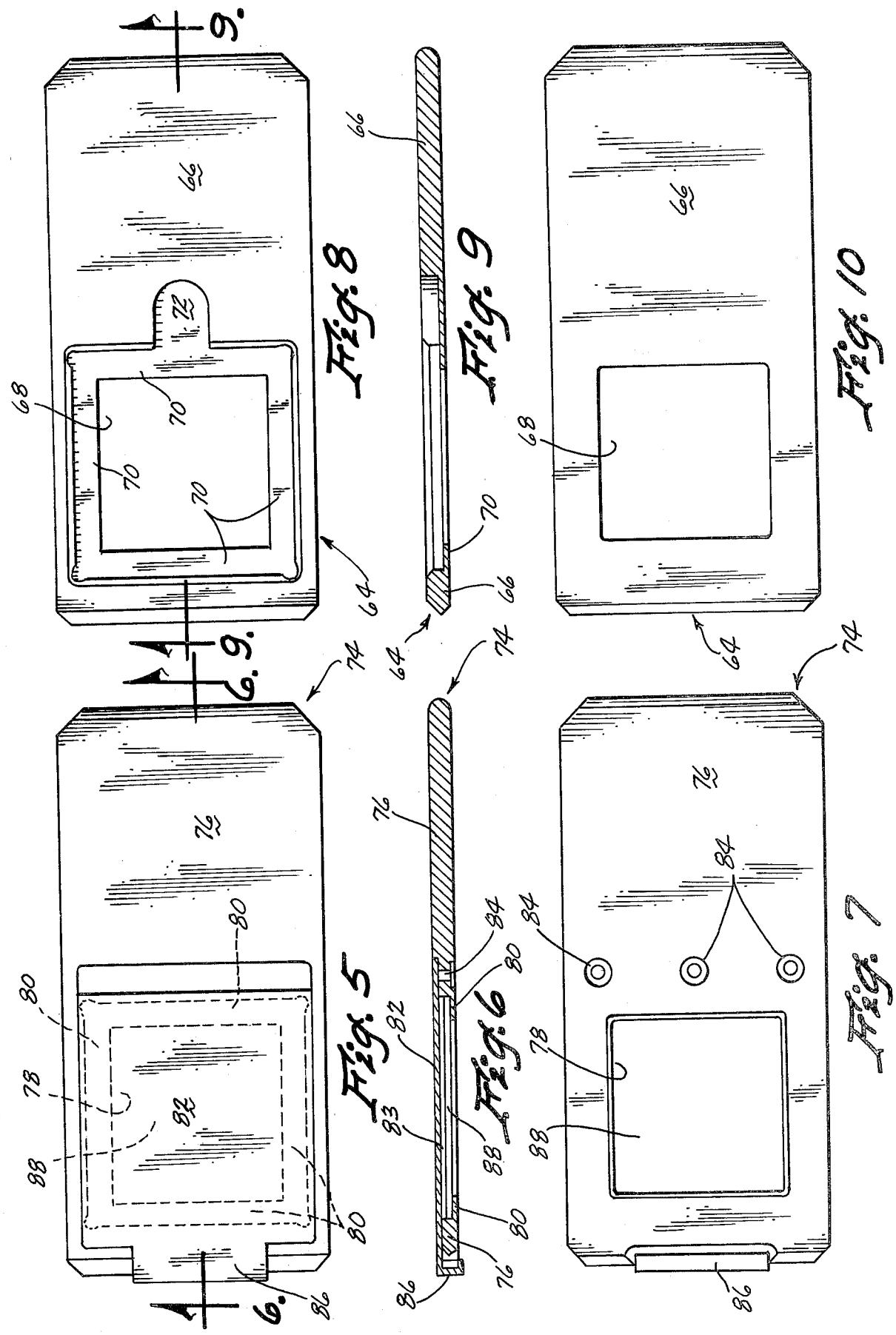

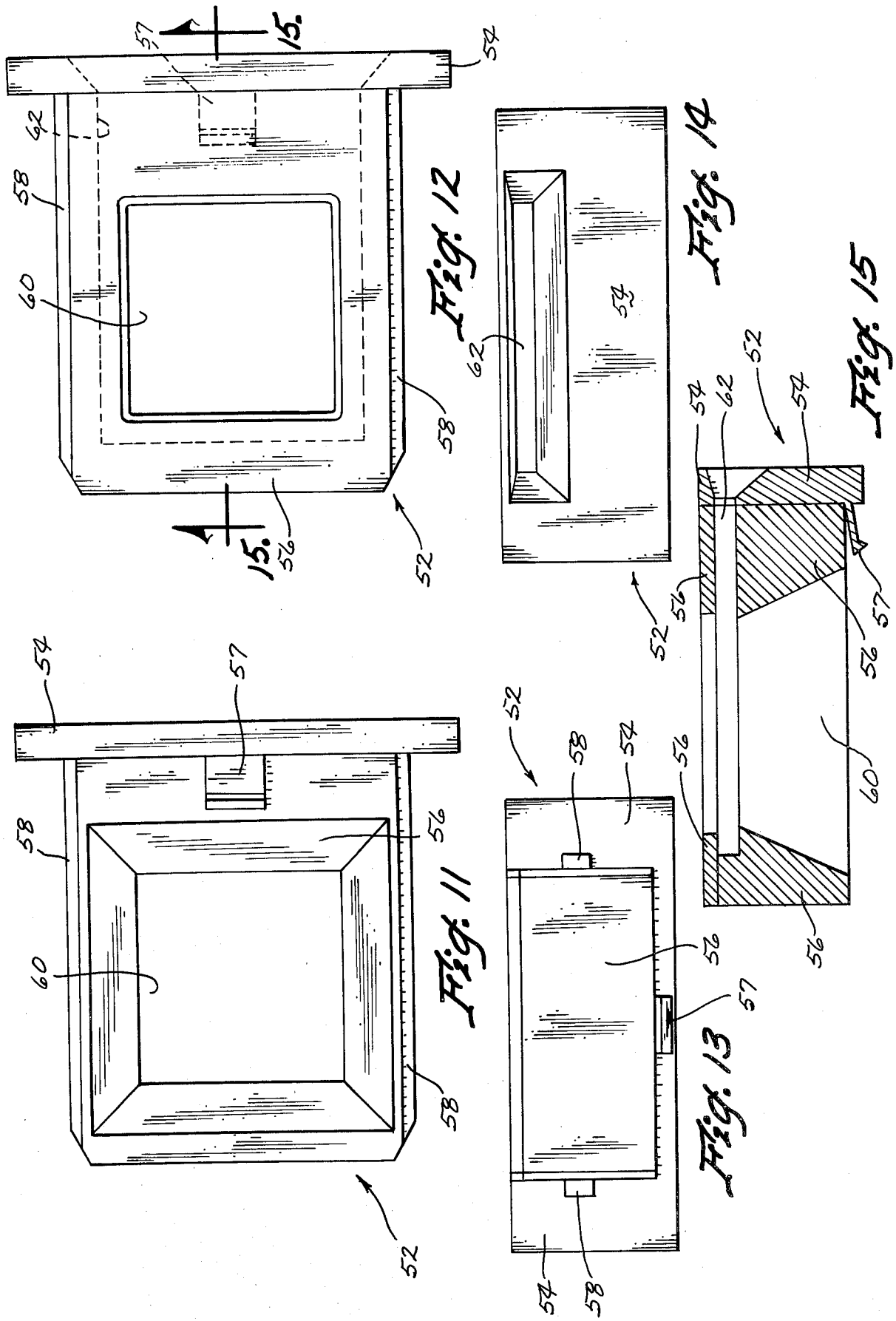

APPARATUS AND METHOD FOR RESIZING ARTWORK

BACKGROUND OF THE INVENTION

The present invention relates generally to an apparatus and method of resizing artwork, and more particularly to an apparatus that is used in conjunction with a headline setter, which apparatus allows the practice of a novel method of resizing existing artwork.

Headline setters such as the device disclosed in the following description and drawings are conventionally used to set headlines from a font of characters used with the device. Headline setters have, however, a single use and have not heretofore been used to resize artwork.

Resizing existing artwork is a task requiring expensive specialized equipment, and heretofore must be performed by experienced personnel. Those in the field of copy preparation recognize the need to make the most efficient use of both expensive equipment and personnel. They therefore welcome a fast, inexpensive, nontechnical alternate to the present method.

SUMMARY OF THE INVENTION

The present invention teaches an apparatus and method of resizing artwork by incorporation of a novel apparatus with a headline setter device.

This invention allows the graphic arts industry to perform the art resizing task with inexpensive equipment and moderately trained personnel. It expands the performance ability of the headline setting device from a single function—the setting of large size type; to dual function—the setting of large size type and the resizing of artwork. It further allows the machine operator to intermingle the two functions, in that the operator can position type as desired over, under, around or through the artwork by using the setter as a type setter and art projector in combination on a single sheet of sensitized paper without resorting to photostats or the paste-up table.

These are totally unique abilities made possible only because of this invention.

An object of the present invention is the provision of an apparatus that, used in conjunction with a headline setter, allows an easy and convenient method of resizing existing artwork.

Other objects, advantages, and novel features of the present invention will become apparent from the following detailed description of the invention when considered in conjunction with the accompanying drawings.

BRIEF DESCRIPTION OF THE DRAWINGS

FIG. 1 is a perspective view of a headline setter incorporating the apparatus for resizing art work of the instant invention;

FIG. 2 is a perspective view showing the insert block which is mounted in the headline setter;

FIG. 3 is a perspective view showing the holder adapted to secure the unexposed photographic film;

FIG. 4 is a perspective view showing the holder adapted to secure the focus slide and exposed film;

FIG. 5 is a top plan view of the holder shown in FIG. 3;

FIG. 6 is a sectional view taken along line 6—6 of FIG. 5;

FIG. 7 is a bottom plan view of the holder shown in FIG. 3;

FIG. 8 is a top plan view of the holder shown in FIG. 4;

FIG. 9 is a sectional view taken along line 9—9 of FIG. 8;

FIG. 10 is a bottom plan view of the holder shown in FIG. 4;

FIG. 11 is a bottom plan view of the insert block shown in FIG. 2;

FIG. 12 is a top plan view of the insert block;

FIG. 13 is a rear elevational view of the insert block;

FIG. 14 is a front elevational view of the insert block;

FIG. 15 is a sectional view taken along line 15—15 of FIG. 12.

DESCRIPTION OF THE PREFERRED EMBODIMENT

Referring now to the drawings wherein like reference numerals designate identical or corresponding parts throughout the several views. FIG. 1 shows a headline setter 10 which incorporates the apparatus for resizing artwork 50 of the present invention.

The headline setter 10 includes a base 12 and a vertically extending frame 14 attached to the rear side of the base 12. A copy board 16 is mounted on the base 12 and is horizontally adjustable with respect thereto by operation of adjustment nob 18.

The vertical frame 14 carries a top light source (not shown) and a blower fan system (not shown) enclosed in head housing 20. A cavity 22 having a removable plate (not shown) is disposed below housing 20. In conventional use of the headline setter 10, the cavity 22 is designed to permit the insertion of a distortion lens. In use with the improvement of the present invention, the sidewalls 24 of cavity 22 are machined to form elongated grooves (not shown) to accomodate an insert block 52, which is described hereinafter.

Below cavity 22 a projection lens 26 is secured to the bottom of bellows 28. Lens 26 is mounted for vertical adjustable movement on rods 30. Lens 26 is secured in position by rack 32 and is vertically adjustable by operation of release lever 34 and fine adjustment control 36. Percentage scales 37 aid the operator in making the desired vertical adjustment.

In conventional use of the headline setter 10, motorized reels 38 control the movement of a film font 40 to position the desired character between the top light source and the projection lens 26. The reels 38 are activated by push buttons 42 located at the front of base 12. Also positioned at the front of base 12 are on-off switch 44 and exposure switch 46 which activates the top light source and the blower fan. Timer 48 is used to time the exposure of a font character on developer treated sensitized paper (not shown) held on the copy board 16. In use with the improvement of the instant invention, the film font 40 is completely taken up on one of the reels 38 so as not to interfere with the artwork resizing operation.

The improvement apparatus for resizing artwork 50, is most clearly shown in FIGS. 2-15. The apparatus 50 includes an insert block 52, a focus slide holder 64, an unexposed film holder 74, and a base light source 90.

The insert block 52 (FIGS. 2 and 11-15) includes an enlarged front face plate 54 attached to a body member 56. A pair of elongated ribs 58 are disposed on opposite sides of body member 56 and these ribs 58 mate with the elongated grooves formed in sidewalls 24. Engagement of ribs 58 in these grooves allows the insert block 52 to be mounted on the headline setter 10 precisely positioned and aligned so that the first vertical opening 60 is located between the top light source and the projection lens 26. The insert block 52 is held in position by snaplock 57. The face plate 54 and the body 56 also include a second horizontal opening or elongated slot 62 which is in communication with the first vertical opening 60.

As most clearly shown in FIGS. 4 and 8–10, the focus slide holder 64 includes an elongated plate 66 having a vertical aperature 68 formed therein. The elongated plate 66 is slideably engageable in and mates with the elongated slot 62 of insert block 52 such that, when inserted, the vertical aperature 68 is aligned with the first vertical opening 60 of insert block 52. A recessed ledge 70 extends around the perimeter of vertical aperature 68 and a recessed finger tab 72 is located at one side of the recessed ledge 70. A projectable image focus slide (not shown) is releaseably held in holder 64 by engagement of the sides thereof with ledge 70 such that the focus slide is disposed within vertical aperature 68 between the top light source and the projection lens 26.

Referring now to FIGS. 3 and 5–7, the unexposed film holder 74 includes an elongated plate 76 having a vertical aperature 78 formed therein. The elongated plate 76 is slideably engageable in and mates with the elongated slot 62 of insert block 52 such that, when inserted, the vertical aperature 78 is aligned with the first vertical opening 60 of insert block 52. A recessed ledge 80 extends around the perimeter of vertical aperature 78. An opaque flap 82 having a waffled side 83 is pivotally attached as by rivets 84 at one side of the vertical aperature 78 and is moveable between a first open position (FIG. 3) and a second closed position (FIG. 6). A friction lock tab 86 frictionally engages the forward edge of plate 76 to hold the flap 82 in the closed position. A transparent membrane 88 is disposed within and is coextensive with the vertical aperature 78. An unexposed photographic film (not shown) is releaseably held in holder 74 by being supported upon the transparent membrane 88 and contacted and prevented from flexing or wrinkling by the waffled side 83 of opaque flap 82. The unexposed film is thus held within the vertical aperture 78 between the opaque flap 82 and the projection lens 26.

The base light source 90 shown in FIG. 1 consists of an elevated bracket 92 attached to the copy board 16 and extending to both sides thereof. Each end of brackets 92 carries a pivotally mounted bar 94 to which a pair of lighting fixtures 96 are attached. The base light source 90 selectively illuminates artwork held on the copy board 16 and exposed yet unexposes photographic film to the image of the artwork.

In operation, the insert block 52 is mounted on a headline setter 10 as described herein, and the headline setter 10, together with the improvement apparatus 50, is used to resize existing artwork. The artwork is placed on the copy board 16 and the focus slide secured in the slide holder 64 is inserted into slot 62. The top light source is activated by exposure switch 46 and the image of the focus slide is projected on the artwork. The vertical position of the projection lens 26 is then adjusted to focus the image of the focus slide on the artwork. The lens 26 is then locked into position, the top light source is deactivated, and the focus slide holder 64 is retracted. An unexposed photographic film is placed in the film holder 74 supported by the transparent membrane 88 and held in position by opaque flap 82. The film holder 74 is then inserted into slot 62. The base light source 90 is activated to illuminate the artwork image and expose the unexposed film to the illuminated image. After exposure the film is removed and developed, the developed film is placed into a mount, which is then secured in the slide holder 64. The holder 64 is then inserted in slot 62 and a piece of the sensitized paper is placed on the copy board 16 and coated with developer solution. The vertical position of projection lens 26 is then adjusted to project the artwork image on the sensitized paper at the desired image size thus exposing the sensitized paper to the desired artwork image.

Obviously, many modifications and variations of the present invention are possible in light of the above teachings. It is therefore to be understood that, within the scope of the appended claims, the invention may be practiced otherwise than as specifically described.

I claim:

1. In combination with a headline setter device including a copy board, a top light source directed toward said copy board, and a lens mounted for adjustable movement between said copy board and said top light source the improvement comprising:

an insert block mounted on said headline setter, and insert block including a first vertical opening disposed between said top light source and said lens, and a second horizontal opening in communication with said first vertical opening;

a selectively movable holder including a vertical aperture and means for releasably holding a projectable image focus slide in said vertical aperture, said holder being slideably insertable within said second horizontal opening such that said focus slide is disposed within said first vertical opening between said top light source and said lens, whereby the image of the focus slide is projected on said copy board and focused by adjustment of said lens;

said holder further including means for releasably holding an unexposed photographic film in said vertical aperture, and an opaque flap disposed to cover said unexposed film, said holder being slideably insertable within said second horizontal opening such that said unexposed film is disposed within said first vertical opening between said opaque flap and said lens; and a base light disposed to illuminate an art work image disposed on said copy board and to expose said unexposed film to said illuminated art work image.

2. The apparatus of claim 1 wherein said second horizontal opening is an elongated slot disposed in mating relationship to said holder, whereby said holder is secured in accurate and precise aligned position in said insert block.

3. The apparatus of claim 1 wherein said insert block includes elongated raised ribs disposed on opposite sides thereof, and wherein said headline setter includes elongated grooves disposed in mating relationship to said ribs, whereby said insert block is mounted on and accurately and precisely positioned and aligned on said headline setter.

4. The apparatus of claim 1 wherein said focus slide holding means includes a recessed ledge disposed at the perimeter of said vertical aperture.

5. The apparatus of claim 1 wherein said unexposed film holding means includes a recessed ledge disposed at the perimeter of said vertical aperture.

6. The apparatus of claim 1 wherein said opaque flap is pivotally attached at one edge to said holder and movable between a first open position and a second closed position.

7. The apparatus of claim 4 further including a recessed finger tab disposed at one side of said recessed ledge, whereby one edge of said focus slide is accessible for removal from the holder.

8. The apparatus of claim 5 further including a transparent membrane disposed within and co-extensive with said vertical aperture, and disposed in supporting relationship to said unexposed film.

9. The apparatus of claim 6 wherein said opaque flap includes a friction lock disposed opposite said pivotal attachment and disposed to frictionally engage an edge of said holder.

10. The apparatus of claim 8 wherein said opaque flap includes a waffled surface disposed in contacting relationship with said unexposed film, whereby the unexposed film is supported on said transparent membrane and secured in position and prevented from flexing or wrinkling while positioned in said holder.

11. The apparatus of claim 3, further including a snap lock attached to said insert block to frictionally engage a member of the headline setter, whereby the insert block is securely locked in position on the headline setter while the holders are being inserted and retracted.

12. A method of resizing artwork on a headline setter device including a copy board, a top light source directed toward said copy board, and a lens mounted for adjustable movement between said copy board and said top light source, the method comprising the steps of:

mounting an insert block on said headline setter, said insert block including a first vertical opening disposed between said top light source and said lens, and a second horizontal opening in communication with said first vertical opening;

positioning an art work image to be resized on said copy board;

placing a projectable image focus slide in a selectively movable holder including a vertical aperture and means for releasably holding a focus slide in said vertical aperture;

inserting said holder within said second horizontal opening such that said focus slide is disposed within said first vertical opening between said top light source and said lens;

activating said top light source to project the image of the focus slide on said art work image disposed on said copy board;

adjusting the vertical position of said lens to focus the projected image into visual clarity on said art work image;

maintaining the position of said lens in said adjusted position;

retracting said holder from said second horizontal opening;

removing said focus slide from said holder;

placing an unexposed photographic film in said holder;

placing an opaque flap over said unexposed film;

inserting said holder within said second horizontal opening such that said unexposed film is disposed within said first vertical opening between said opaque flap and said lens;

activating a base light to illuminate said art work image and to expose said unexposed film to said illuminated art work image;

removing said art work image from said copy board;

retracting said holder from said second horizontal opening;

removing said opaque flap;

removing said exposed film from said holder;

developing said exposed film;

placing said developed film in said holder;

inserting said holder within said second horizontal opening such that said developed film is disposed within said first vertical opening between said top light source and said lens;

placing a predetermined size piece of sensitized paper on said copy board;

applying developer to said paper;

adjusting the vertical position of said lens to project the art work image on said paper at the desired image size; and exposing said paper to said resized art work image.

* * * * *